(12) United States Patent
Tanizawa

(10) Patent No.: US 7,528,593 B2
(45) Date of Patent: May 5, 2009

(54) CURRENT MEASURING DEVICE

(75) Inventor: Yukihiko Tanizawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 78 days.

(21) Appl. No.: 11/593,564

(22) Filed: Nov. 7, 2006

(65) Prior Publication Data

US 2007/0052408 A1    Mar. 8, 2007

Related U.S. Application Data

(62) Division of application No. 11/183,781, filed on Jul. 19, 2005, now abandoned.

(30) Foreign Application Priority Data

Jul. 23, 2004    (JP) ............................. 2004-215740

(51) Int. Cl.
*G01R 15/20* (2006.01)
*G01R 33/07* (2006.01)
*G01R 15/18* (2006.01)
*G01R 19/20* (2006.01)

(52) U.S. Cl. .............................. 324/117 H; 324/117 R

(58) Field of Classification Search .............. 324/117 H, 324/117 R
See application file for complete search history.

(56) References Cited

U.S. PATENT DOCUMENTS 5,250,894 A    10/1993    Bridges et al.

5,570,034 A * 10/1996    Needham et al. ............ 324/763
6,917,193 B1    7/2005    Howard et al.

FOREIGN PATENT DOCUMENTS

| JP | A-7-209336 | 8/1995 |
|---|---|---|
| JP | A-8-194016 | 7/1996 |
| JP | A-2001-33491 | 2/2001 |
| JP | A-2001-153895 | 6/2001 |
| JP | A-2002-286764 | 10/2002 |
| JP | A-2002-350470 | 12/2002 |
| JP | A-2003-510612 | 3/2003 |
| JP | A-2003-194574 | 7/2003 |
| JP | A-2003-315376 | 11/2003 |

OTHER PUBLICATIONS

Office Action dated Jan. 9, 2009 in corresponding Japanese Patent Application No. 2004-215740 (and English translation).

* cited by examiner

*Primary Examiner*—Ha Tran T Nguyen
*Assistant Examiner*—Roberto Velez
(74) *Attorney, Agent, or Firm*—Posz Law Group, PLC

(57) ABSTRACT

A current measuring device for detecting current flowing in a current path includes a magnetic sensor for detecting a magnetic field and a magnetic sensor for detecting earth magnetism, the magnetic field detecting magnetic sensor and the earth magnetism detecting magnetic sensor being disposed along the direction of magnetic flux induced by the current flowing in the current path, wherein an earth magnetism component detected by the magnetic field detecting magnetic sensor is canceled by using earth magnetism detected by the earth magnetism detecting magnetic sensor.

2 Claims, 4 Drawing Sheets

CURRENT MEASURING DEVICE

CROSS REFERENCE TO RELATED APPLICATION

The present application is a division of application Ser. No. 11/183,781 filed on Jul. 19, 2005, and is based upon, claims the benefit of priority of, and incorporates by reference the contents of, Japanese Patent Application No. 2004-215740 filed on Jul. 23, 2004.

FIELD OF THE INVENTION

The present invention relates to a current measuring device for measuring current flowing in a current path by detecting magnetic flux occurring due to the current with a magnetic sensor.

BACKGROUND OF THE INVENTION

The current of batteries for vehicles has been recently increased in connection with increase of electric equipment, and it instantaneously reaches several hundreds A order. On the other hand, in order to reduce the fuel consumption of vehicles, engine-charging control has been carried out so that power generation based on an electric generator is stopped during acceleration, but electricity generated is increased during deceleration or the like. Even in the engine—charging control described above, it has been required to accurately detect "discharge current—charging current" of batteries in order to carry out proper charging so that the capacity of the batteries is not lowered.

According to a current measuring device for detecting large current such as battery current or the like, current flowing in a current path is determined by detecting magnetic flux occurring due to the current with a magnetic sensor. The current measuring device described above is provided with a magnetic shield so as to exclude an earth magnetism effect causing an error when high detection precision is required as described above. A current measuring device having a magnetic shield as described above is disclosed in JP-A-2001-33491, for example.

However, the magnetic shield is formed of permalloy or the like, and the cost of production thereof is high. In addition, a fabricating step is needed, resulting in increase of the manufacturing cost of the current measuring device.

With respect to the conventional current measuring device using the magnetic sensor, A C-shaped magnetic core is used, and when current is supplied to a current path disposed at the center of the magnetic core, the magnetic flux density proportional to the current is detected by a magnetic sensor inserted in the gap therebetween. When the magnetic core is used as described above, most of the magnetic flux passes through the inside of the magnetic core, and thus magnetic shield can be established by manufacturing a magnetic shield member covering the magnetic core. However, when no magnetic core is used and magnetic flux caused by the current path is directly detected by a magnetic sensor, it is impossible to carry out effective magnetic shield and it is difficult to cancel the effect of earth magnetism, so that the detection precision is lowered. Therefore, it has been hitherto indispensable to use a magnetic core which can easily perform as a magnetic shield.

SUMMARY OF THE INVENTION

In view of the foregoing situation, an object is to provide a current measuring device that can measure a current value with avoiding an effect of earth magnetism and without any magnetic shield.

In order to attain the above object, according to a first aspect, a current measuring device for detecting current flowing in a current path comprises a magnetic-field detecting magnetic sensor and an earth-magnetism detecting magnetic sensor that are disposed along the direction of a magnetic flux induced by the current flowing in the current path, wherein an earth magnetism component detected by the magnetic-field detecting magnetic sensor is canceled by using an earth magnetism component detected by the earth-magnetism detecting magnetic sensor.

Furthermore, according to a sixth aspect, a current measuring device for detecting current flowing in a current path comprises two magnetic sensors that are disposed along the direction of magnetic flux induced by the current flowing in the current path so that the detection directions thereof are opposite to each other, wherein an earth magnetism component is detected on the basis of the difference between the outputs of the two magnetic sensors, and the earth magnetism component thus detected is canceled.

In the current measuring device of the first aspect, the magnetic-field detecting magnetic sensor and the earth magnetism detecting magnetic sensor are provided along the direction of the magnetic flux induced by the current flowing in the current path. The earth magnetism component detected by the magnetic-field magnetic sensor is canceled by using the earth magnetism component detected by the earth magnetism detecting magnetic sensor. Therefore, the value of the current flowing in the current path can be accurately measured without using any magnetic shield and without being affected by earth magnetism. Furthermore, it is possible to accurately measure the value of the current by canceling the effect of the earth magnetism even when no C-shaped magnetic core is used.

In the above current measuring device of the second aspect, the current path is provided with a right angle portion in section, and the magnetic-field detecting magnetic sensor is disposed at a vertical upper side to one side of the right angle portion of the current path. Therefore, the magnetic flux occurring at the current path can be detected with high sensitivity. Furthermore, the earth magnetism detecting magnetic sensor is disposed out of the vertical upper side to the one side of the right angle portion of the current path. Therefore, the earth magnetism component can be detected without being greatly affected by the magnetic flux occurring at the current path. That is, the detection output of the earth magnetism detecting magnetic sensor is not greatly influenced by the magnetic flux. Therefore, when the detection output of the earth magnetism detecting magnetic sensor is subtracted from the detection output of the magnetic-field detecting magnetic sensor, the detection output value of the magnetic-field detecting magnetic sensor is not subtracted, so that the current value flowing in the current path can be accurately measured.

In the current measuring device of the third aspect, the magnetic-field detecting magnetic sensor and the earth magnetism detecting magnetic sensor are disposed on a sensor chip, and a circuit chip is disposed in parallel to a line L connecting the magnetic-field detecting magnetic sensor and the earth magnetism detecting magnetic sensor. Here, the earth magnetism detecting magnetic sensor is disposed so as to be far away from the magnetic-field detecting magnetic sensor so that the earth magnetism detecting magnetic sensor is not affected by the magnetic flux, so that the sensor chip is made slender. In this device, by arranging the circuit chip in parallel, the wiring length between the sensor chip and the circuit chip can be shortened.

In the current measuring device of the fourth aspect, the magnetic-field detecting magnetic sensor and the earth magnetism detecting magnetic sensor are mounted on a circuit chip for processing signals from the magnetic-field detecting magnetic sensor and the earth magnetism detecting magnetic sensor. Therefore, the structure can be simplified, and also the connection between the chips by bonding or the like is unnecessary.

In the current measuring device of the fifth aspect, the magnetic-field detecting magnetic sensor is disposed in the gap of the magnetic core, and the earth magnetism detecting magnetic sensor is disposed out of the gap of the magnetic core. Therefore, the earth magnetism detecting magnetic sensor can detect the earth magnetism component without being greatly affected by the magnetic flux occurring at the current path. That is, the detection output of the earth magnetism detecting magnetic sensor is hardly affected by the magnetic flux, and thus when the detection output of the earth magnetism detecting magnetic sensor is subtracted from the detection output of the magnetic-field detecting magnetic sensor, the gain of the detection output of the magnetic-field detecting magnetic sensor is not subtracted, so that the value of the current flowing in the current path can be accurately measured.

A current measuring device of the sixth aspect for detecting current flowing in a current path comprises two magnetic sensors disposed along the direction of magnetic flux induced by the current flowing in the current path so that the detection directions thereof are opposite to each other, and an earth magnetism component is detected on the basis of the output difference of the two magnetic sensors to cancel the earth magnetism component thus detected. The output amount based on the magnetic flux of the magnetic sensor is equal to the output amount based on the opposite-direction magnetic flux of the magnetic sensor, and thus by adding (subtracting) both the output amounts, only the earth magnetism component can be accurately detected. By canceling this earth magnetism component, the magnetic flux can be detected without reducing the gain, and the current value can be very accurately measured without using any magnetic shield and also without being affected by earth magnetism.

In the current measuring device of the seventh aspect, at least one of the two magnetic sensors is manufactured on a circuit chip for processing signals from the two magnetic sensors by a MOS manufacturing process. Since the magnetic sensor is simultaneously formed by the MOS process for forming the circuits, the manufacturing can be performed in low cost. Here, when the magnetic sensor (for example, Hall element) is formed by the MOS Process, the sensitivity is lowered. However, only the earth magnetism component can be accurately detected on the basis of the output difference of the magnetic sensors, so that the current value can be very accurately measured by using the magnetic sensor of the MOS manufacturing process which has low sensitivity.

BRIEF DESCRIPTION OF THE DRAWINGS

The above and other objects, features and advantages will become more apparent from the following detailed description made with reference to the accompanying drawings.

DETAILED DESCRIPTION OF THE PREFERRED EMBODIMENTS

Preferred embodiments will be described hereunder with reference to the accompanying drawings.

First Embodiment

Figure 1A:
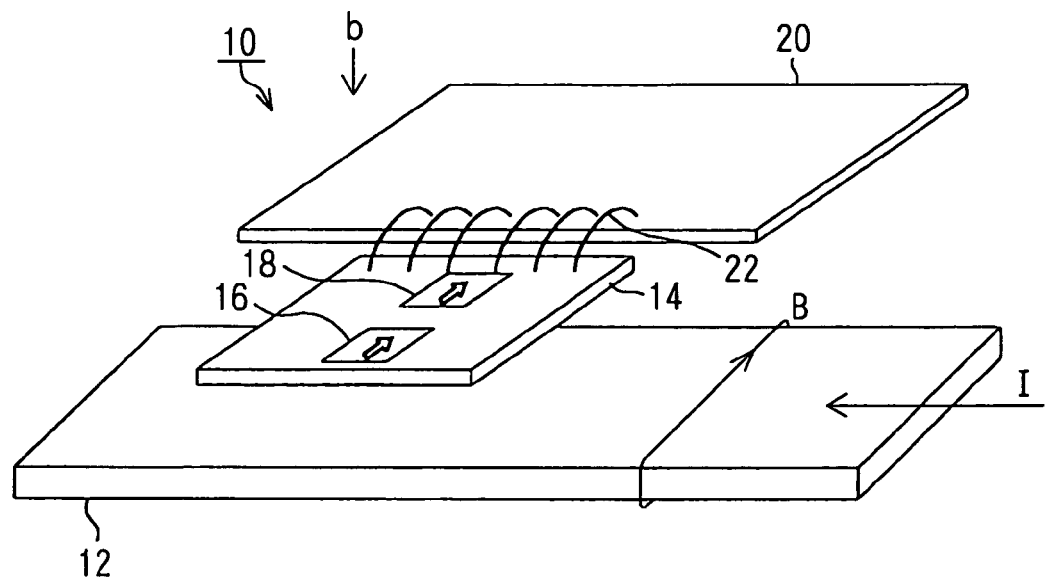
FIG. 1A is a perspective view showing the construction of a current measuring device according to a first embodiment.
Figure 1B:
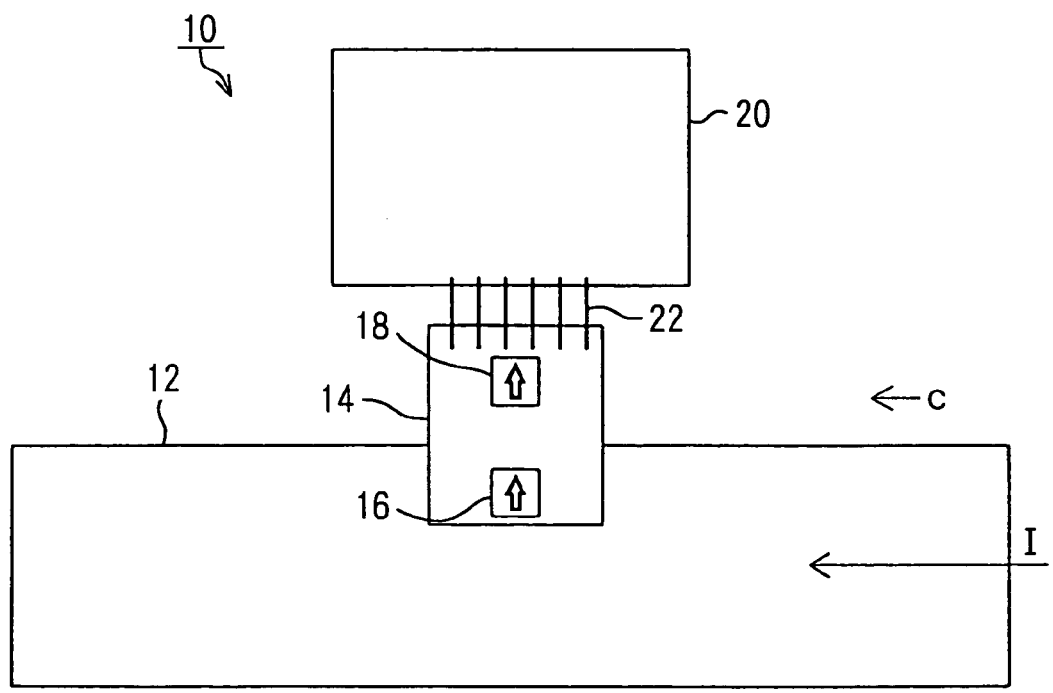
FIG. 1B is a plan view showing the current measuring device.

A current measuring device according to a first embodiment will be described with reference to FIGS. 1 and 2. FIG. 1A is a perspective view showing the construction of the current measuring device of the first embodiment, and FIG. 1B is a plan view showing the current measuring device. FIG. 1B corresponds to a view taken along an arrow b of FIG. 1A.

The current measuring device 10 measures discharge current—charging current of a battery for a vehicle, and it comprises a bus bar 12 connected to a battery, a magnetic-field detecting magnetic sensor 16 for detecting magnetic flux B induced by current I flowing in the bus bar 12, an earth magnetism detecting magnetic sensor 18 for detecting earth magnetism, a sensor chip 14 on which the magnetic-field detecting magnetic sensor 16 and the earth magnetism detecting magnetic sensor 18, a circuit chip 20 for correcting an earth magnetism component on the basis of the output potential difference from the magnetic-field detecting magnetic sensor 16 and the earth magnetism detecting magnetic sensor 18 and carrying out temperature compensation to calculate a current value I, and bonding wires 22 for connecting the sensor chip 14 and the circuit chip 20. The magnetic-field detecting magnetic sensor 16 and the earth magnetism detecting magnetic sensor 18 are formed of the same Hall element, and disposed in the direction of the magnetic flux B parallel to the upper surface of the sensor chip, that is, disposed so as to detect the magnetic flux in the direction perpendicular to the axial line direction of the bus bar 12. The bus bar 12, the sensor chip 14 and the circuit chip 20 are accommodated in a casing (not shown).

Each magnetic sensor has a magnetically detectable direction, and arrows illustrated on the magnetic-field detecting magnetic sensor 16 and the earth magnetism detecting magnetic sensor 18 represent detecting directions in each figure. Furthermore, the earth magnetism component described in this specification means a detecting direction component of an earth magnetism vector.

Figure 2:
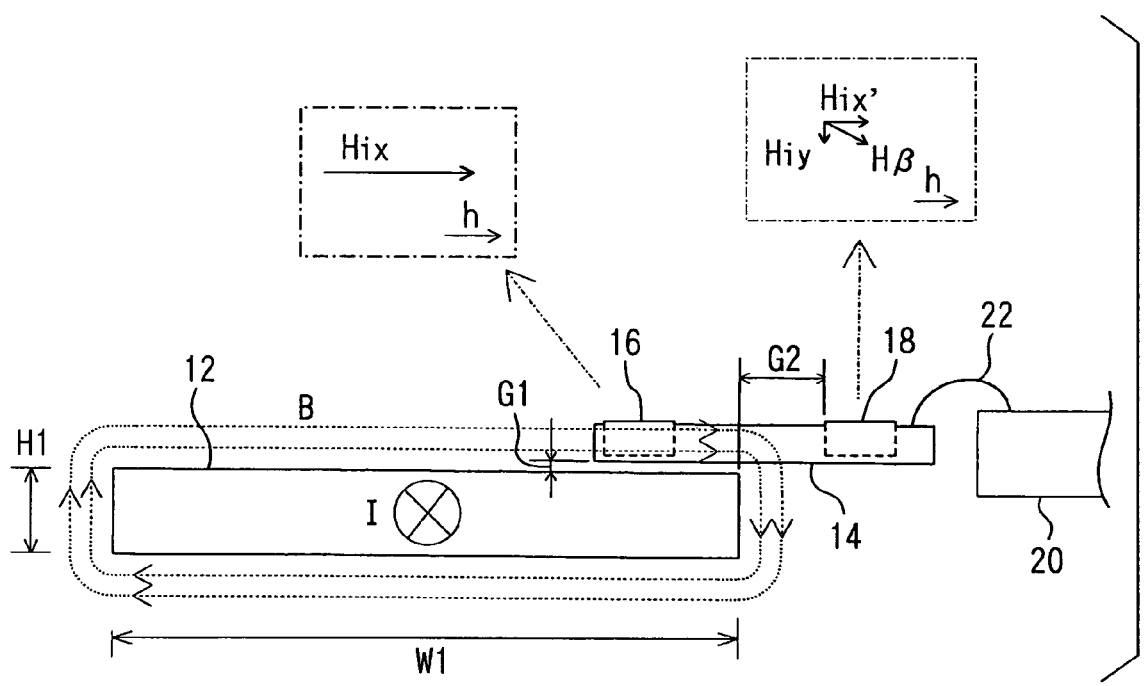
FIG. 2 is a diagram showing magnetic flux detected by a magnetic-field detecting magnetic sensor and an earth-magnetism detecting magnetic sensor of the current measuring device according to the first embodiment.

FIG. 2 is a diagram showing magnetic flux occurring in the current measuring device according to the first embodiment, and it corresponds to a view taken along an arrow c of FIG. 1B.

The bus bar 12 is formed of good conductive metal such as brass or the like, and designed to be 20 mm in width W1 and 2 mm in thickness H1. The gap G1 between the bus bar 12 and the sensor chip 14 is set to 1 mm. It is desirable to set a gap of 2 mm or more in the horizontal distance between the end face of the bus bar 12 and the earth magnetism detecting magnetic sensor 18 in order to reduce the effect of the magnetic flux at the magnetic-field detecting magnetic sensor 16. Here, the magnetic-field detecting magnetic sensor 16 is disposed at the vertical upper side above the upper surface of the bus bar 12 having a rectangular cross-sectional shape. The earth magnetism detecting magnetic sensor 18 is disposed out of the vertical upper side above the upper surface of the bus bar 12 and also out of the horizontal position to the right side edge of the bus bar 12 in the figures.

The magnetic flux B flows substantially in parallel to each side of the rectangular cross-sectional shape of the bus bar 12. As shown in the figures, the magnetic-field detecting magnetic sensor 16 disposed at the vertical upper side above the upper surface of the bus bar 12 detects a horizontal component Hix and an earth magnetism component h of magnetic flux, and outputs as an output potential difference V1 a voltage (Vh+Vhh) achieved by augmenting the voltage Vh based on the magnetic flux component Hix with the voltage Vhh based on the earth magnetism component h.

At the earth magnetism detecting magnetic sensor 18 disposed out of the vertical upper side above the upper surface of the bus bar 12, magnetic flux Hβ smaller than the horizontal component Hix of magnetic flux detected by the magnetic-field detecting magnetic sensor 16 occurs because it is far from the bus bar 12. The earth magnetism detecting magnetic sensor 18 detects both the horizontal component Hix' and the earth magnetism component h. Accordingly, the earth magnetism detecting magnetic sensor 18 outputs as an output potential difference V2 a voltage (Vh'+Vhh) achieved by augmenting the voltage Vh' based on the magnetic flux component Hix' with the voltage Vhh based on the earth magnetism component h. The earth magnetism component h detected by the magnetic-field detecting magnetic sensor 16 is equal to the earth magnetism component h detected by the earth magnetism detecting magnetic sensor 18. Here, as compared with the horizontal component Hix of the magnetic flux, the magnetic flux Hix' and the earth magnetic component h are smaller, and thus the output potential difference V1>the output potential difference V2 is satisfied.

The circuit chip 20 described above subtracts the output potential difference V2 of the earth magnetism detecting magnetic sensor 18 from the output potential difference V1 of the magnetic-field detecting magnetic sensor 16 to cancel the earth magnetism component h.

That is, $$V1-V2=(Vh+Vhh)-(Vh'+Vhh)=Vh-Vh'$$

Here, the output potential difference V1 of the magnetic-field detecting magnetic sensor 16 is subtracted by the amount corresponding to the voltage Vh' based on the magnetic flux component Hix' detected by the earth magnetism detecting magnetic sensor 18. However, the perfect proportionality relationship is satisfied between the horizontal component Hix and the magnetic flux component Hix' of the magnetic flux, and thus even when sensitivity is slightly reduced, the detection precision is not substantially lowered by increasing the amplification at a subsequent stage.

According to the current measuring device of the first embodiment, the earth magnetism component h detected by the magnetic-field detecting magnetic sensor 16 is canceled by using the earth magnetism component h detected by the earth magnetism detecting magnetic sensor 18. Therefore, the value of the current I flowing in the bus bar 12 can be accurately measured without using any magnetic shield and also without being affected by earth magnetism. Furthermore, the value of the current I can be accurately measured by canceling the effect of earth magnetism without using any C-shaped magnetic core.

According to the current measuring device of the first embodiment, the magnetic-field detecting magnetic sensor 16 is disposed at a vertical position above the upper surface of the bus bar 12. Therefore, it can detect the magnetic flux B occurring at the bus bar 12 with high sensitivity. On the other hand, the earth magnetism detecting magnetic sensor 18 is disposed out of the vertical upper side above the upper surface of the bus bar 12 and also out of the horizontal side to the side edge of the bus bar 12. Therefore, the earth magnetism component h can be detected without being greatly affected by the magnetic flux B occurring at the bus bar 12. That is, the output potential difference V2 of the earth magnetism detecting magnetic sensor 18 is not greatly affected by the magnetic flux B. Therefore, when the output potential difference V2 of the earth magnetism detecting magnetic sensor 18 is subtracted form the output potential difference V1 of the magnetic-field detecting magnetic sensor 16, the output potential difference V1 of the magnetic-field detecting magnetic sensor 16 is not greatly reduced, and thus the current value flowing in the bus bar 12 can be accurately measured.

Second Embodiment

Figure 3A:
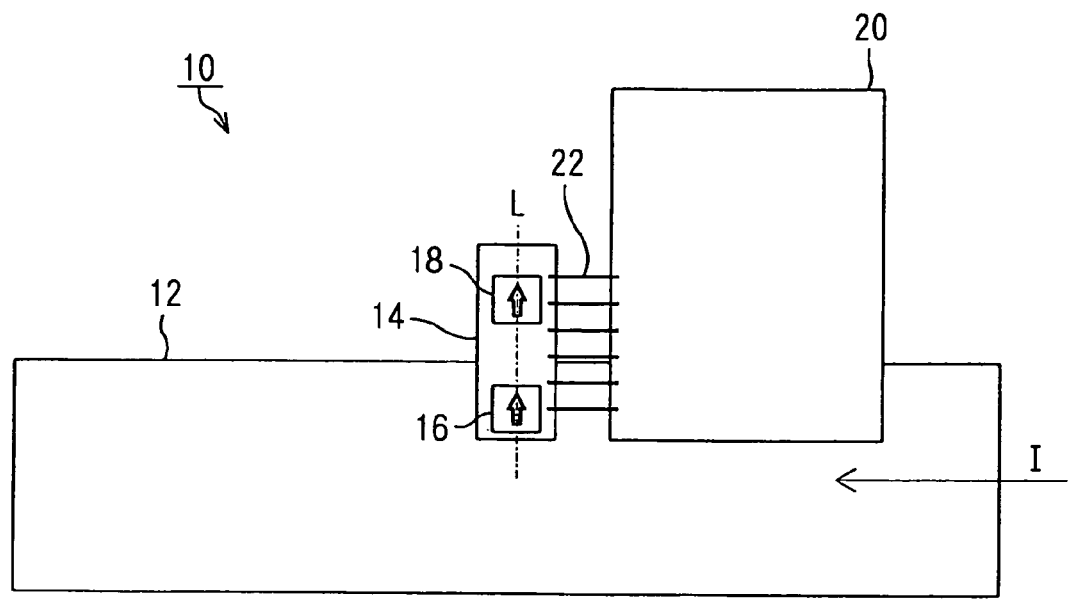
FIG. 3A is a plan view showing the construction of a current measuring device according to a second embodiment.

The current measuring device according to a second embodiment will be described with reference to FIG. 3A which is a plan view of the current measuring device of the second embodiment.

As described with reference to FIG. 1B, in the first embodiment, the circuit chip 20 is disposed at one side of the sensor chip 14 with respect to the current direction of the bus bar 12. On the other hand, in the second embodiment, the circuit chip 20 is disposed in parallel to a line L connecting the magnetic-field detecting magnetic sensor 16 and the earth magnetism detecting magnetic sensor 18.

The earth magnetism detecting magnetic sensor 18 is disposed so as to be far away from the magnetic-field detecting magnetic sensor 16 so that the earth magnetism detecting magnetic sensor 18 is not affected by the magnetic flux B, and thus the sensor chip 14 is made slender. In the second embodiment, the circuit chip 20 is disposed in parallel to the sensor chip 14, whereby the wires containing the bonding wires 22 from the magnetic-field detecting magnetic sensor 16 and the earth magnetism detecting magnetic sensor 18 on the sensor chip 14 can be uniformly shortened.

Third Embodiment

Figure 3B:
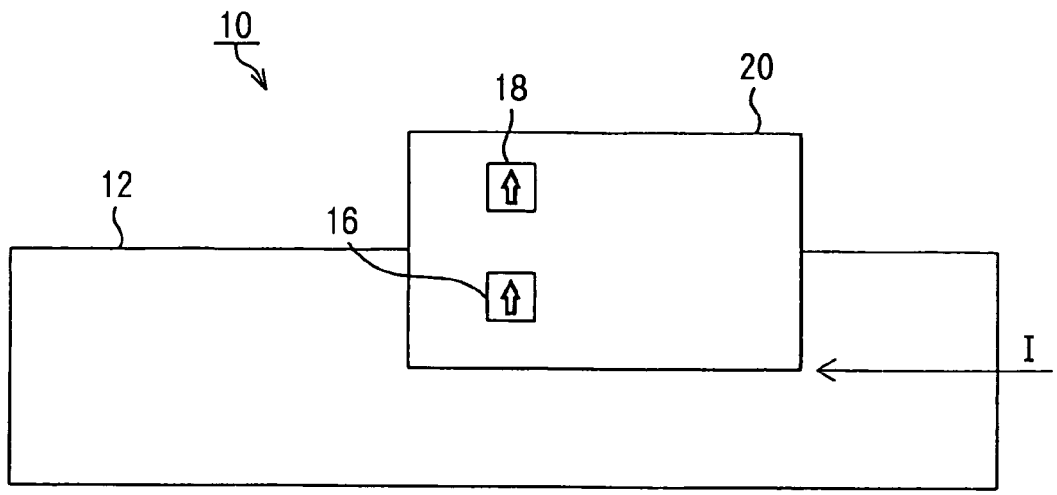
FIG. 3B is a plan view showing the construction of a current measuring device according to a third embodiment.

A current measuring device according to a third embodiment will be described with reference to FIG. 3B which is a plan view showing the current measuring device of the third embodiment.

As described with reference to FIG. 1B, in the first embodiment, the magnetic-field detecting magnetic sensor 16 and the earth magnetism detecting magnetic sensor 18 are disposed on the sensor chip 14. On the other hand, according to the third embodiment, the magnetic-field detecting magnetic sensor 16 and the earth magnetism detecting magnetic sensor 18 is mounted on the circuit chip 20 for processing signals. Therefore, the structure can be simplified, and also the connection between the chips by the bonding wires or the like is unnecessary. It is desirable to enhance the detection precision that the magnetic-field detecting magnetic sensor 16 and the earth magnetism detecting magnetic sensor 18 are manufactured by a dedicated semiconductor manufacturing process different from an MOS semiconductor manufacturing step for forming circuit elements on the circuit chip 20.

Fourth Embodiment

Figure 4:
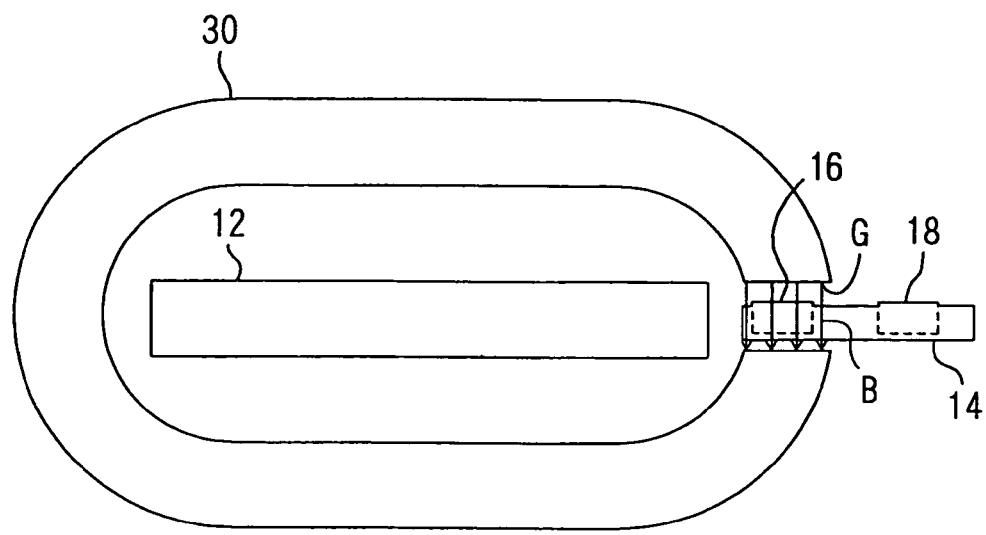
FIG. 4 is a diagram showing a current measuring device according to a fourth embodiment.

A current measuring device according to a fourth embodiment will be described with reference to FIG. 4 which shows the current measuring device of the fourth embodiment.

As described with reference to FIGS. 1A and 1B, in the first embodiment, the magnetic-field detecting magnetic sensor 16 is directly disposed above the bus bar 12. On the other hand, in the fourth embodiment, a C-shaped magnetic core 30 is used, and the magnetic-field detecting magnetic sensor 16 is disposed in the gap G of the C-shaped magnetic core 30. The earth magnetism detecting magnetic sensor 18 is disposed out of the gap G of the C-shaped magnetic core 30. Furthermore, the magnetic sensor in the first to third and fifth embodiments detects the magnetic component parallel to the surface of the sensor chip 14. FIG. 4 is an illustration drawn on the assumption that the magnetic sensor detects the magnetic component vertical to the surface of the sensor chip.

In the fourth embodiment, the earth magnetism detecting magnetic sensor 18 can detect the earth magnetism h without being affected by the magnetic flux B occurring at the bus bar 12. That is, most of the magnetic flux occurring at the bus bar 12 passes through the C-shaped magnetic core 30 and the gap G, and thus the output potential difference of the earth magnetism detecting magnetic sensor 18 is hardly affected by the magnetic flux B. Therefore, when the output potential difference of the earth magnetism detecting magnetic sensor 18 is subtracted from the output potential difference of the magnetic-field detecting magnetic sensor 16, the output value of the magnetic-field detecting magnetic sensor 16 is not subtracted, so that the value of the current I flowing in the bus bar 12 can be accurately measured.

Fifth Embodiment

A current measuring device according to a fifth embodiment will be described with reference to FIG. 5 which shows the current measuring device of the fifth embodiment.

As described above with reference to FIG. 2, in the first embodiment, the earth magnetism detecting magnetic sensor 18 is disposed so as to be far away from the bus bar 12. On the other hand, in the fifth embodiment, two magnetic sensors 16A and 16B are used and disposed in proximity to the bus bar 12. That is, in the current measuring device of the fifth embodiment, the two magnetic sensors 16A and 16B are disposed along the direction of the magnetic flux B induced by current flowing in the bus bar 12 so that the detection directions thereof are opposite to each other, and specifically they are arranged so that the magnetic sensor 16A is disposed along the upper surface of the bus bar 12 and the magnetic sensor 16B is disposed along the lower surface of the bus bar 12.

Figure 5:
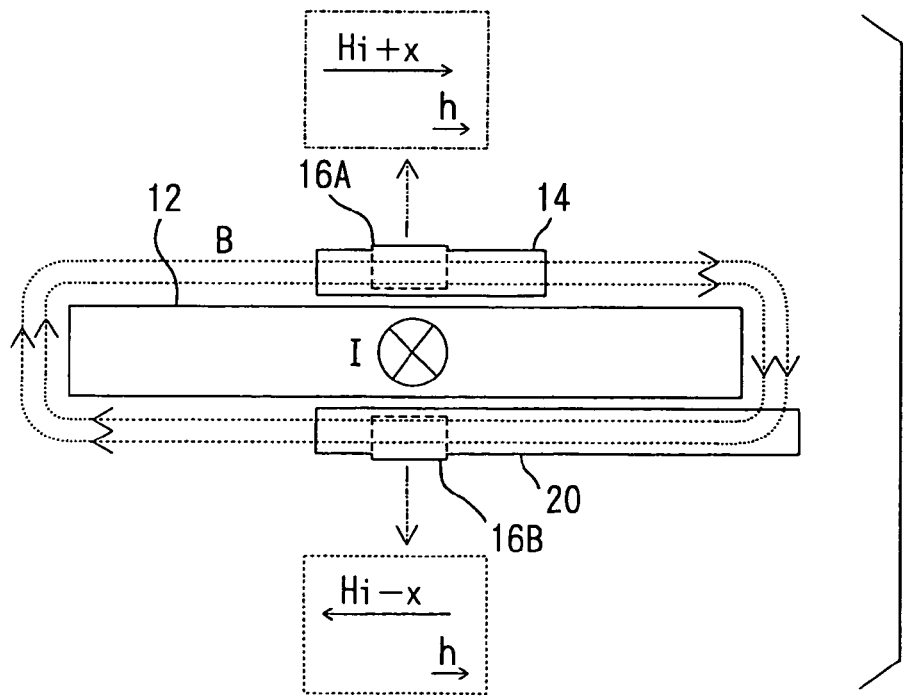
FIG. 5 is a diagram showing a current measuring device according to a fifth embodiment.

As shown in FIG. 5, the magnetic sensor 16A disposed at the upper surface side of the bus bar 12 detects the horizontal component Hi+x of the magnetic flux (here, the rightward horizontal component of the magnetic flux is represented by +x in FIG. 5) and the earth magnetism component h, and outputs as an output potential difference V1 a voltage (Vh+Vhh) achieved by augmenting the voltage Vh based on the magnetic flux component Hi+x with the voltage Vhh based on the earth magnetism component h.

On the other hand, the magnetic sensor 16B disposed at the lower surface side of the bus bar 12 detects the horizontal component Hi−x of the magnetic flux (here, the leftward horizontal component of the magnetic flux is represented by −x in FIG. 5) and the earth magnetism component h, and outputs as an output potential difference V2 a voltage (−Vh+Vhh) achieved by augmenting the voltage −Vh based on the magnetic flux component Hi−x with the voltage Vhh based on the earth magnetism component h.

Here, in the circuit chip 20 described above, the output potential difference V2 of the magnetic sensor 16B is subtracted from the output potential difference V1 of the magnetic sensor 16A to cancel the earth magnetism component h. That is, $$V1-V2=(Vh+Vhh)-(-Vh+Vhh)=2Vh$$

The output based on the magnetic flux B of the magnetic sensor 16A and the output based on the magnetic flux B of the magnetic sensor 16B are equal to each other, the earth magnetism h can be canceled by subtracting both the output, so that the current value I can be very accurately measured without being affected by earth magnetism without using magnetic shield.

Furthermore, in the current measuring device 10 of the fifth embodiment, by forming the magnetic sensor 16B of a Hall element, it is manufactured on the circuit chip 20 for processing signals by the MOS semiconductor manufacturing process. Likewise, the magnetic sensor 16A may be manufactured by the MOS semiconductor manufacturing process. In the fifth embodiment, the magnetic sensor 16B is simultaneously formed by the MOS semiconductor manufacturing process for forming the circuits, and thus it can be manufactured in low cost. Here, the sensitivity is generally low if the Hall element is formed by the MOS process. However, in the fifth embodiment, only the magnetic flux based on the current I can be accurately detected on the basis of the output difference between the magnetic sensor 16A and the magnetic sensor 16B, and thus the current value I can be also accurately measured by using even the low-sensitivity Hall element manufactured in the MOS manufacturing process.

In the above-described embodiments, the Hall element is used as the magnetic sensor, however, it is needless to say that the current measuring device can be achieved by using a magnetic resistance element.

What is claimed is:

1. A current measuring device for detecting current flowing in a bus bar comprising; a magnetic sensor for detecting magnetic field; and a magnetic sensor for detecting earth magnetism, the magnetic field detecting magnetic sensor and the earth magnetism detecting magnetic sensor being disposed along the direction of magnetic flux induced by the current flowing in the bus bar, wherein an earth magnetism component detected by the magnetic-field detecting magnetic sensor is canceled by using earth magnetism detected by the earth magnetism detecting magnetic sensor, wherein the bus bar has a right angle portion in a cross-section orthogonal to the bus bar, the magnetic field detecting magnetic sensor is disposed at a vertical upper side to one side of the right angle portion of the bus bar, and the earth magnetism detecting magnetic sensor is disposed away from the vertical upper side to another side of the right angle portion of the bus bar.

2. The current measuring device of claim 1, wherein the magnetic field detecting magnetic sensor and the earth magnetism detecting magnetic sensor are formed of the same Hall element.

* * * * *